(12) United States Patent
Lo et al.

(10) Patent No.: US 6,914,333 B2
(45) Date of Patent: Jul. 5, 2005

(54) WAFER LEVEL PACKAGE INCORPORATING DUAL COMPLIANT LAYERS AND METHOD FOR FABRICATION

(75) Inventors: Wei-Chung Lo, Junghe (TW);
Hsin-Chien Huang, Hsinchu (TW);
Ming Lu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 248 days.

(21) Appl. No.: 10/233,802

(22) Filed: Sep. 3, 2002

(65) Prior Publication Data

US 2004/0043538 A1 Mar. 4, 2004

(51) Int. Cl.[7] .............................................. H01L 23/48
(52) U.S. Cl. ............... 257/737; 257/778; 257/E23.021; 257/E23.069; 257/E21.508
(58) Field of Search .................. 257/737, 778, 257/750, 723, 738, E23.021, E23.069, E21.508, E23.067, E23.111

(56) References Cited

U.S. PATENT DOCUMENTS

| 5,851,911 A | * | 12/1998 | Farnworth | 438/614 |
| 6,071,755 A | * | 6/2000 | Baba et al. | 438/106 |
| 6,235,552 B1 | * | 5/2001 | Kwon et al. | 438/106 |
| 6,277,669 B1 | * | 8/2001 | Kung et al. | 438/106 |
| 6,433,427 B1 | * | 8/2002 | Wu et al. | 257/737 |
| 6,743,660 B2 | * | 6/2004 | Lee et al. | 438/108 |

* cited by examiner

Primary Examiner—Michael S. Lebentritt
Assistant Examiner—Ron Pompey
(74) Attorney, Agent, or Firm—Akin Gump Strauss Hauer & Feld, LLP

(57) ABSTRACT

A wafer level package that incorporates dual compliant layers and a metal cap layer on top of I/O pads and a method for forming the package. The wafer level package includes a plurality of metal cap layers formed on top of a plurality of I/O pads to function as stress buffering and avoiding sharp corners in metal traces formed on top of the metal cap layers. A first compliant layer and a second compliant layer are formed under the metal trace to provide the necessary standoff and to accommodate differences in coefficients of thermal expansion of the various materials on an IC die. The wafer level package is particularly suitable for copper devices or in devices wherein copper lines are used.

16 Claims, 3 Drawing Sheets

WAFER LEVEL PACKAGE INCORPORATING DUAL COMPLIANT LAYERS AND METHOD FOR FABRICATION

FIELD OF THE INVENTION

The present invention generally relates to a wafer level package having a multiplicity of IC dies formed thereon and a method for fabrication and more particularly, relates to a wafer level package having a multiplicity of IC dies thereon each incorporating dual compliant layers and metal cap layers for improved reliability and processability and a method for such fabrication.

BACKGROUND OF THE INVENTION

In the fabrication of modern semiconductor devices, the ever increasing device density and decreasing device dimensions demand more stringent requirements in the packaging or interconnecting techniques in such high density devices. Conventionally, a flip-chip attachment method has been used in packaging of semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become more difficult.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique. Similarly, the thin film electrodeposition technique which also requires a ball limiting metallurgy layer to be deposited and defined by an etching process which has the same limitations as the C4 technique.

In recent years, chip scale packages (CSP) have been developed as a new low cost packaging technique for high volume production of IC chips. One of such chip scale packaging techniques has been developed by the Tessera Company for making a so-called micro-BGA package. The micro-BGA package can be utilized in an environment where several of the packages are arranged in close proximity on a circuit board or a substrate much like the arrangement of individual tiles. Major benefits achieved by a micro-BGA package are the combined advantages of a flip chip assembly and a surface mount package. The chip scale packages can be formed in a physical size comparable to that of an IC chip even though, unlike a conventional IC chip such as a flip chip, the chip scale package does not require a special bonding process for forming solder balls. Furthermore, a chip scale package may provide larger number of input/output terminals than that possible from a conventional quad flat package, even though a typical quad flat package is better protected mechanically from the environment.

In a typical micro-BGA package, a flexible interposer layer (which may contain circuit) is used to interconnect bond pads on an IC chip to an array of solder bump connections located on a flexible circuit. The flexible circuit, normally of a thickness of approximately 25 nm, is formed of a polymeric material such as polyimide which is laminated to a silicon elastomer layer of approximately 150 nm thick. The silicon elastomeric layer provides flexibility and compliance in all three directions for relief of stresses and thermal expansion mismatches. To further reduce the fabrication cost of IC devices, it is desirable that if a whole wafer can be passivated to seal the IC dies on the wafer, and then be severed into individual IC dies from the wafer such that not only the benefits of a chip scale package can be realized, the packaging cost for the IC dies may further be reduced.

The conventional flip-chip bonding process requires multiple preparation steps for IC chips, i.e. the formation of aluminum bond pads on the chip, the under-bump-metallurgy process on the bond pads and the deposition of solder required in the bumping process. The substrate that the IC chip is bonded to requires a flux coating in order to ensure an acceptable bond strength is formed between the solder bumps and the conductive elements on the substrate surface. The flip chip bonding process further requires a reflow process for the bumps, a flux cleaning process to eliminate excess flux material from the surface of the bump, a drying process after the cleaning process, an underfill process for dispensing an underfill material, and an underfill curing process to minimize thermal stresses in the underfill and in the joint formed.

The conventional method for depositing solder bumps described above presents a number of processing difficulties. For instance, in modern high-density semiconductor devices, the distance between I/O pads in a peripheral array continuously being reduced. In order to maintain a minimal required distance between the I/O pads, an I/O pad redistribution process must be conducted such that the pads can be transformed from a peripheral array to an area array. During the pad redistribution process, a plurality of metal traces must be formed to extend the I/O pads from the periphery of an IC die to the center of the IC die. It is desirable that, in order to assure the reliability of the die, a stress buffer layer is provided under the plurality of metal traces to buffer, or absorb, the stress incurred during the fabrication processes and to avoid stress cracking or fracture of the metal traces. The application of the stress buffering layers has been difficult in that if too thin a layer is applied, the stress buffering effect is insufficient to ensure the reliability of the IC die. However, when too thicker a layer of the stress buffering material is applied, numerous processing difficulties are incurred in the application process. Even though commercial stress buffering materials have been available in the marketplace, the fabrication technology for applying such materials to a satisfactory thickness has not been developed.

In a co-pending application Ser. No. 09/761,487, assigned to the common assignee of the present invention, a wafer level package that incorporates dual stress buffer layers for I/O redistribution was disclosed. This is shown in FIGS. 1A and 1B. A silicon substrate 12 has a multiple number of IC chip 10 formed on top. Each of the IC chip 10 has at least one first I/O pad 14, at least one conductive plug 18 formed on top of the I/O pad 14 for conducting electricity, a first stress buffer layer 20 formed of an elastic material and covers a first dielectric layer 16 while exposing the top of the conductive plug 18. A second stress buffer layer 22, formed of an elastic material on top of the first stress buffer layer 20 in-between the conductive plugs 18. A plurality of conductive traces 24 each having a first end that is electrically connected to the conductive plug 18. A second end of the conductive traces 24 extend toward a center of the IC die 10. A second dielectric layer 26 is formed on top of the plurality of conductive traces 24 insulating the plurality of conductive traces from each other while exposing a plurality of second I/O pads 28. A plurality of solder balls 32 are formed on the plurality of second I/O pads 28 with a UBM (under bump metallurgy) layer 30 therein between. The plurality of solder balls 32 is arranged in an area array. The second stress buffer layer 22 may be formed of a single protruded island, as shown in FIG. 1B, on top of the first stress buffer layer 20, or formed of a plurality of protruded islands 22 on top of the first stress buffer layer 20, as shown in FIG. 1A.

The wafer level package structure 10 shown in FIGS. 1A and 1B, while capable of reducing the thermal stress caused by the different coefficient of thermal expansions of the different materials, nevertheless presents the problem that a sharp interface 35 is formed in-between the conductive plug 18 and the first stress buffer layer 20. Due to the different values of the coefficient of thermal expansion of the materials that form the conductive plug 18 and the first stress buffer layer 20, fracture is frequently discovered at the sharp joint, i.e. at the 90° joint, or interface 35 due to the coefficient of thermal expansion differences when the package is heated or cooled during processing.

It is therefore an object of the present invention to provide a wafer level package that incorporates dual compliant layers for I/O redistribution that does not have the drawbacks or shortcomings of the conventional wafer level packages.

It is another object of the present invention to provide a wafer level package that incorporates dual compliant layers for I/O redistribution that does not present any fabrication problems.

It is a further object of the present invention to provide a wafer level package that incorporates dual compliant layers for I/O redistribution wherein the layers are applied by a spin coating, a screen printing or a stencil printing technique.

It is another further object of the present invention to provide a wafer level package that incorporates dual compliant layers for I/O redistribution wherein a compliant material having a Young's modulus of less than 6 MPa is utilized.

It is still another object of the present invention to provide a wafer level package that incorporates dual compliant layers for I/O redistribution wherein two separate compliant layers are first formed prior to the formation of a plurality of metal traces on top.

It is yet another object of the present invention to provide a wafer level package that incorporates dual compliant layers for I/O redistribution wherein a first compliant layer and a second compliant layer are sequentially deposited onto an IC die each to a thickness between about 4 $\mu$m and about 100 $\mu$m.

It is still another further object of the present invention to provide a method for forming a wafer level package which can be carried out by depositing a first compliant layer and a second compliant layer sequentially by a technique selected from spin coating, screen printing, laminating, and stencil printing.

It is yet another further object of the present invention to provide a method for forming a wafer level package by incorporating dual compliant layers for I/O pad redistribution by forming a plurality of metal traces on top of two separate layers of compliant materials each having a Young's modulus of less than 6 MPa.

SUMMARY OF THE INVENTION

In accordance with the present invention, a wafer level package incorporating dual compliant layers and a method for fabricating the wafer level package are disclosed.

In a preferred embodiment, a wafer level package that incorporates dual compliant layers and optionally metal cap layers may be provided which includes a wafer that has a multiplicity of IC dies formed on an active surface; each of the multiplicity of IC dies further includes a plurality of first I/O pads formed on a top surface insulated by a first dielectric layer deposited therein-between; a plurality of metal cap layers with one formed on each of the plurality of first I/O pads providing electrical communication with the pads; the plurality of metal cap layers each having a thickness sufficiently small so as to allow an adjacent tapered shoulder of a first compliant layer to be formed; a first compliant layer of a first elastic material having tapered shoulder formed on top of the first dielectric layer; a second compliant layer of a second elastic material on top of the first compliant layer; a plurality of metal traces formed on top of the first and second compliant layers each in electrical communication with one of the plurality of metal cap layer at a first end and extends toward a center of the IC die at a second end; a second dielectric layer formed on top of the plurality of metal traces insulating the latter from each other while exposing a plurality of second I/O pads with one on each of the second end of the plurality of metal traces; and a plurality of solder balls formed on the plurality of second I/O pads.

In the wafer level package incorporating dual compliant layers, the first I/O pads may be arranged in a periphery array and the second I/O pads may be arranged in an area array. The first and second I/O pads may be fabricated of a material selected from the group consisting of Cu, Al, Cu alloys and Al alloys. The first complaint layer may be formed of an elastic material that has a Young's modulus of less than 6 MPa, or the second compliant material may be formed of an elastic material that has a Young's modulus smaller than a Young's modulus of the first compliant layer. The first compliant layer may be formed to a thickness between about 4 $\mu$m and about 20 $\mu$m, or the second compliant layer may be formed to a thickness larger than a thickness of the first compliant layer. The wafer level package may further include a UBM layer in-between the plurality of solder balls and the plurality of second I/O pads. The second compliant layer may be formed in a single protruded island on top of the first compliant layer, or may be formed in a plurality of protruded islands on top of the first compliant layer. The plurality of metal cap layers may each have a thickness of less than 10 $\mu$m, or the first compliant layer formed on top of the first dielectric layer does not have angles of corners that cover edges of the first dielectric layer smaller than 105°.

In an alternate embodiment, a wafer level package that incorporates dual compliant layers may be provided which includes, instead of a plurality of metal cap layers, a plurality of metal traces that are formed on top of the first and second compliant layers each in direct electrical contact with one of the plurality of the first I/O pads. This embodiment is more suitable for use in an aluminum process, when no copper lines are involved.

The invention further provides a method for forming a wafer level package by incorporating dual compliant layers which can be carried out by the operating steps of first providing a wafer that has a multiplicity of IC dies formed on an active surface; forming a plurality of first I/O pads on the multiplicity of IC dies insulated by a first dielectric layer deposited therein-between; forming a plurality of metal cap layers with one on each of the plurality of I/O pads in electrical communication with the pads; depositing a first compliant layer of a first elastic material that has a tapered shoulder on top of the first dielectric layer; depositing a second compliant layer of a second elastic material on top of the first compliant layer; forming a plurality of metal traces on top of the first and second compliant layers each having a first end in electrical communication with one of the plurality of metal cap layers and a second end extending toward a center of the IC die; depositing a second dielectric layer on top of the plurality of metal traces insulating the latter from each other; exposing a plurality of second I/O pads with one on each of the plurality of metal traces; and forming a plurality of solder balls on the plurality of second I/O pads.

The method for forming a wafer level package by incorporating dual compliant layers may further include the step of providing the first elastic material and the second elastic material in a material that has a Young's modulus of less than 6 MPa. The method may further include the step of depositing the first compliant layer to a thickness between about 4 µm and about 20 µm. The method may further include the step of depositing the second compliant layer to a thickness larger than a thickness of the fist compliant layer. The method may further include the step of arranging the plurality of second I/O pads in an area array, or the step of depositing the second compliant layer in a plurality of islands in the second elastic material.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a wafer level package that incorporates dual compliant layers and, optionally, a metal cap layer on top of I/O pads, for improving the reliability of the package. In a preferred embodiment, the second compliant layer is formed in a plurality of protruded islands for supporting solder balls, while in an alternate embodiment, the second compliant layer is formed in a single layer for supporting a plurality of solder balls.

In the present invention wafer level package structure that incorporates dual compliant layers, no conductive plugs or via plugs are formed on top of the I/O pads. As a result, sharp corners in the metal traces subsequently formed or the 90° interface between the first compliant layer and the conductive plug can be avoided and thus, any potential breakage of the metal traces due to the sharp corners or high interface stress are eliminated. The present invention wafer level package structure further provides the benefits that, by utilizing the dual compliant layers, the height of the solder ball standoff can be maintained, the adhesion of a metal trace to the I/O pad can be improved (by using the metal cap layer), the throughput of the packaging process can be increased and furthermore, the reliability of the integrated package can be improved by using existing bumping equipment.

Figure 1A:
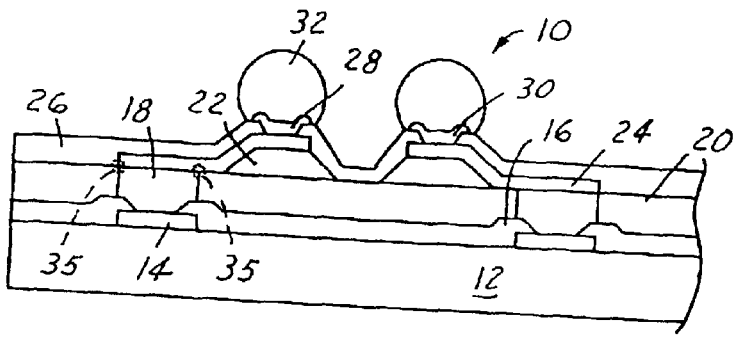
FIG. 1A is an enlarged, cross-sectional view of a wafer level package incorporating dual stress buffer layers and a plurality of protruded islands of the co-pending application.
Figure 1B:
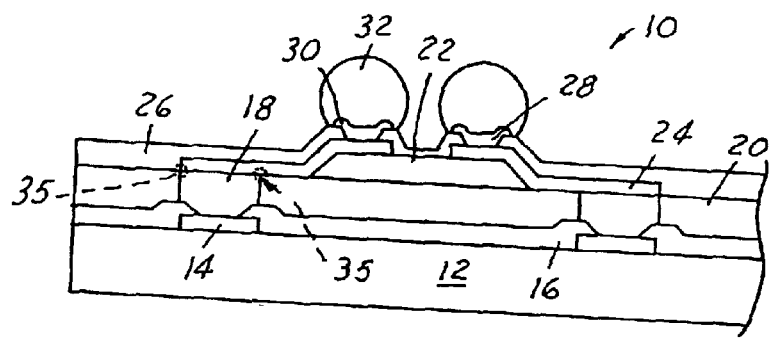
FIG. 1B is an enlarged, cross-sectional view of a wafer level package incorporating dual stress buffer layers and a single protruded island of the co-pending application.
Figure 2A:
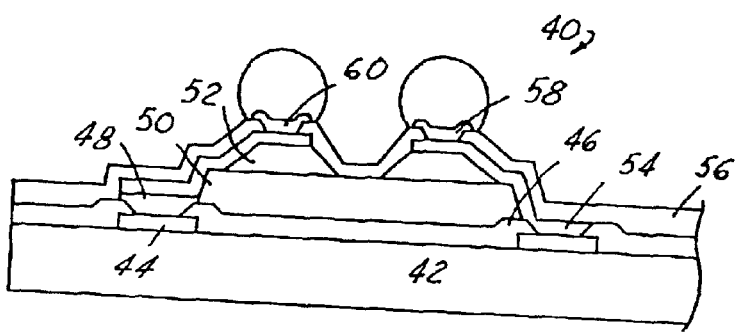
FIG. 2A is an enlarged, cross-sectional view of a preferred embodiment of the present invention wafer level package incorporating dual compliant layers with solder balls on a plurality of protruded islands.

Referring now to FIG. 2A, wherein a present invention preferred embodiment of a wafer level package 40 that incorporates dual compliant layers which is built on a silicon substrate 42 is shown. Each of the IC dies 40 is provided with at least one first I/O pad 44, a plurality of metal cap layers 48 with one formed on top of each of the first I/O pads 44 for electrical conduction, a first compliant layer 50 which is formed on top of the silicon substrate 42, while exposing the top surface of the metal cap layer 48, a second compliant layer 52 which is formed on top of the first compliant layer 50 that is not covered by a metal cap layer 48. The IC die 40 is further provided with a plurality of metal traces 54 with each one having a first end that is in electrical communication with the metal cap layer 48, and an opposite end extending outwardly and formed on top of the second compliant layer 52. A dielectric layer 56 covers the metal trace 54 for protection. A plurality of second I/O pads 58 having their top surfaces exposed are formed on top of the second end of the metal trace 54 for providing electrical communication. A plurality of solder balls 62 are formed on top of the second I/O pads for electrical conduction.

In the wafer level package structure 40 shown in FIG. 2A, the plurality of metal traces 54 is formed of Cu. The metal cap layer 48, which is deposited on top of the first I/O pads 44, functions as a buffer and protective layer for the Cu traces. In a fabrication process wherein aluminum wires are used for the metal traces, the forming step of the metal cap layer 48 can be eliminated and thus, reducing the extra processing steps required for forming the metal cap layers 48.

In the preferred embodiment, an elastic material that has a Young's modulus smaller than 6 MPa is used for forming the first and the second compliant layers 50 and 52, respectively. For instance, an elastic material can be selected from the group consisting of Dow Corning HIPC Q1-4939, Dow Corning HIPC SDA 6501 and Shin Etsu KJR 9050E. It has been found that when the Young's modulus of the elastic material is larger than 6 MPa, the hardness of the elastic material may be too high for the application. Furthermore, due to the difference in coefficients of thermal expansion of the various materials on top of the IC die, a large thermal stress may be induced during heating or cooling. If the Young's modulus of the materials are too high, then there is no stress buffering effect which may lead to poor reliability of the IC die constructed.

It is also preferred that the Young's modulus of the elastic material selected for the first compliant layer 50 should be higher than the Young's modulus of the elastic material selected for the second compliant layer 52. Similarly, the first compliant layer 50 may be formed of a material that has a lower coefficient of thermal expansion, while the second compliant layer 52 may be deposited of a material that has a higher coefficient of thermal expansion. This provides an improved stress buffering effect from the dual compliant layers. A suitable thickness for the first compliant layer 50 to be formed is between about 4 and about 20 $\mu$m, while a suitable thickness for the second compliant layer 52 to be formed may be between about 4 and about 100 $\mu$m. The word "about" used in this writing indicated a range of value that is ±10% of the average value given. A suitable total height of the first and second compliant layers 50,52 is important such that a desirable standoff may be obtained for the solder balls which further improves the reliability of the wafer level package. Moreover, the dual compliant layers also provide the necessary electrical characteristics for a high frequency element such that the wafer level package can be suitably used in high frequency element applications such as in Rambus DRAM.

The material that forms the first and the second I/O pads 44,58 may be selected from the group consisting of Cu, Al, Al alloys and Cu alloys. An additional under-bump-metallurgy (UBM) layer 60 is normally formed on top of the second I/O pads 58 for improving adhesion with a solder ball 62 formed on top of the pad 58.

Figure 2B:
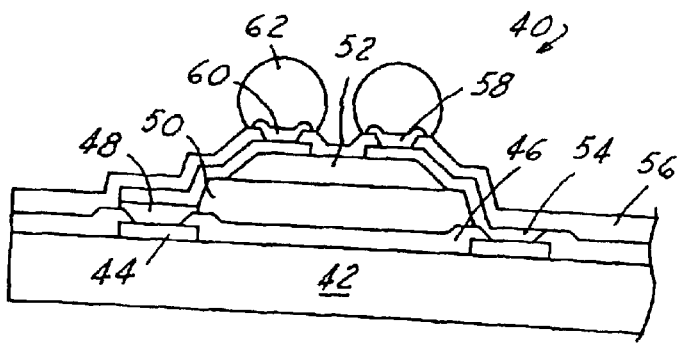
FIG. 2B is an enlarged, cross-sectional view of an alternate embodiment of the present invention wafer level package incorporating dual compliant layers with solder balls on a single protruded island.

It is noted that in the preferred embodiment of the present invention wafer level package 40 shown in FIG. 2A, the second compliant layer 52 is formed in a plurality of protruded islands, the second compliant layer 52 may also be formed into a single protruded island such as that shown in FIG. 2B.

The present invention method for forming the wafer level package that incorporates dual compliant layers can be shown in FIGS. 3A~3D for a preferred embodiment, and in FIGS. 4A~4D for an alternate embodiment.

Figure 3A:
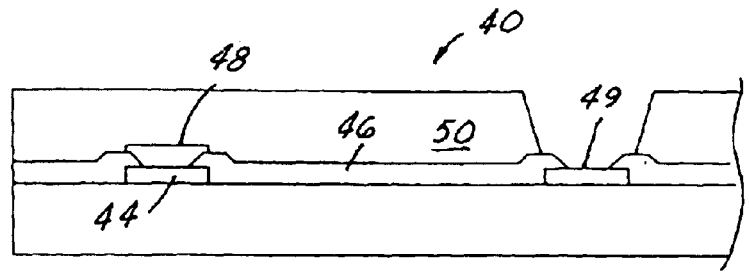
FIGS. 3A~3D illustrate processing steps for forming the preferred embodiment of the present invention wafer level package for building solder balls on a plurality of protruded islands.

As shown in FIG. 3A, in the first step of the process for forming the wafer level package structure 40, a plurality of first I/O pads 44 is first formed on top of a silicon substrate 42. A dielectric material layer 46 that is an insulating layer is then deposited on top of the structure 40 which embeds and insulates the first I/O pad 44. The first I/O pad 44 is formed of an electrically conductive metal such as Cu or Al.

In the next step of the process, the dielectric material layer 46 is patterned to expose the top surface of the I/O pad 44. The metal cap layer 48 is then deposited of an electrically conductive metal by an electroplating technique. The metal cap layer 48 provides electrical communication with the I/O pad 44 when the metal cap layer 48 is formed of Al, Cu, Al alloys or Cu alloys. Other techniques for forming the metal cap layer 48 may also be utilized, for instance, techniques of such as screen printing or stencil printing.

After the formation of the metal cap layer 48, a first compliant layer 50 is formed on top by a technique of printing, spin coating or laminating. The first compliant layer 50 may suitably have a thickness between about 4 $\mu$m and about 20 $\mu$m that covers the top of the silicon substrate 42. The first compliant layer 50 may be formed of an elastic material selected from the group consisting of Dow Corning HIPC Q1-4939, Dow Corning HIPC SDA 6501 and Shin Etsu KJR 9050E. As previously disclosed, when aluminum wires are used as the metal traces, the forming process for the metal cap layer 48 may not be necessary.

Figure 3B:
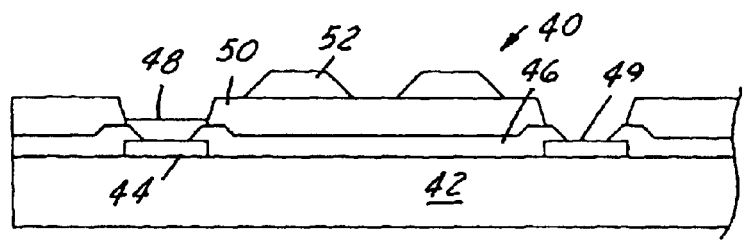

In the next step of the process, as shown in FIG. 3B, an etch back process is conducted on top of the first compliant layer 50 in order to expose the top surface of the metal cap layer 48. A second compliant layer 52 is then printed on top of the first compliant layer 50 to a thickness between about 4 $\mu$m and about 100 $\mu$m. The second compliant layer 52 may be suitably printed into a plurality of protruded islands on top of the first compliant layer 50. The material used for printing the second compliant layer 52 may be similar to that used in printing the first compliant layer 50, or an elastic material that has a Young's modulus small than the first compliant layer. In other words, the elastic material used in printing the second compliant layer 52 may be softer than the elastic material used in printing the first compliant layer 50. In general, the coefficient of thermal expansion of the elastic material used in printing the second compliant layer 52 may be larger than the coefficient of thermal expansion of the elastic material used in printing the first compliant layer 50.

Figure 3C:
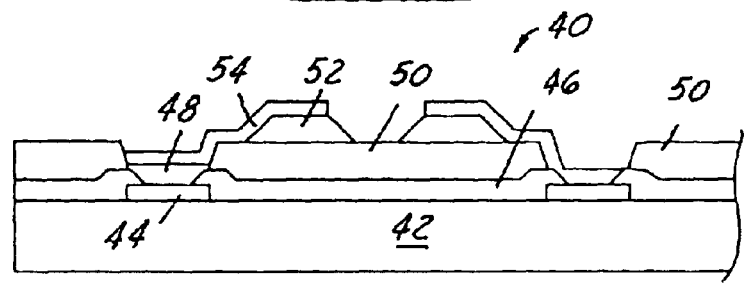

Metal traces 54 are then patterned and formed, as shown in FIG. 3C. By using a photolithographic technique, the metal traces 54 extend the first I/O pad 44 from the peripheral region of the IC die 40 to the central region of the IC die 40, i.e. changing the I/O structure from a peripheral array to an area array in an I/O pad redistribution process. During the pad redistribution process, a metal layer of high electrical conductivity is first deposited on top of the first and second compliant layers 50,52. The deposition technique may be sputtering of a high electrical conductivity metal such as Cu or Al. A conventional photolithographic technique is then used to define the metal traces 54 in the metal layer and forming the metal traces. For instance, as shown in FIG. 3C, the metal trace 54 is electrically connected at a first end to the metal cap layer 48, and extends an opposite end to the top of the second compliant layer 52. When there is no need for the metal cap layer 48, i.e. when the metal traces used are aluminum wires, the metal trace 54 may be directly connected to the top of the I/O pad 44.

Figure 3D:
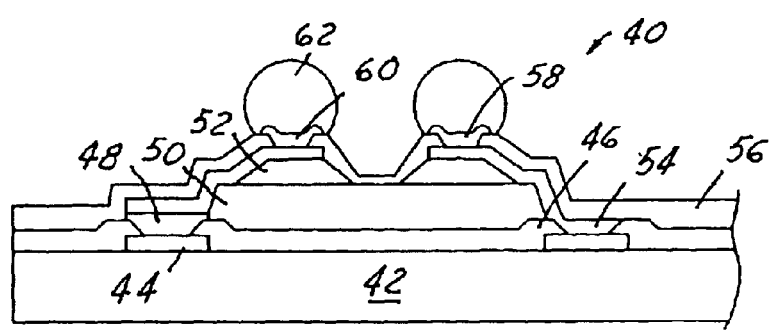
Figure 4A:
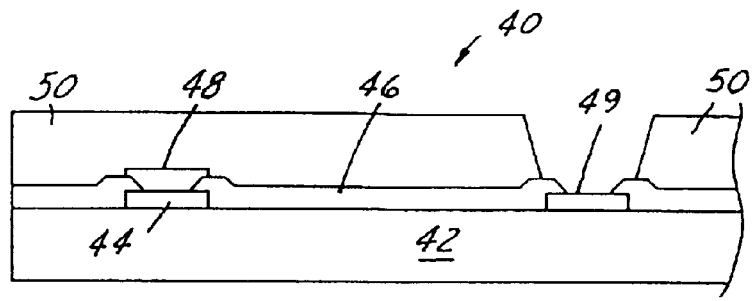
FIGS. 4A~4D are enlarged, cross-sectional views illustrating the process steps for forming the alternate embodiment of the present invention wafer level package by building solder balls on a single protruded island.
Figure 4B:
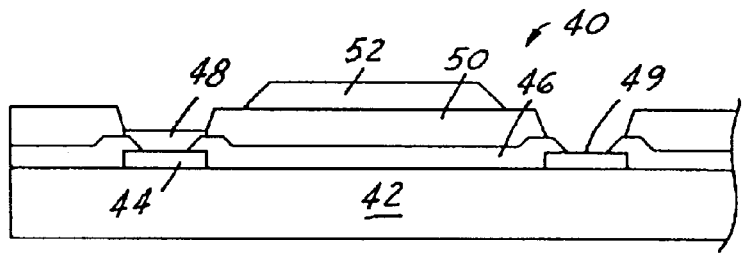
Figure 4C:
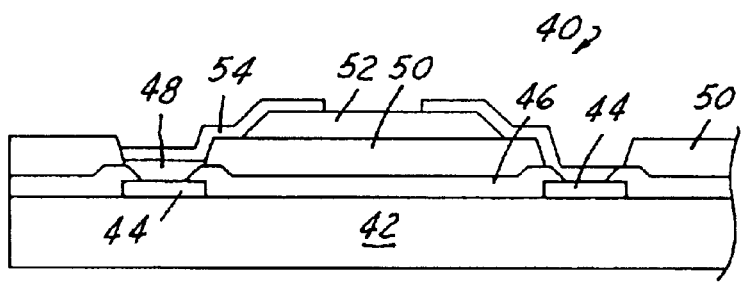
Figure 4D:
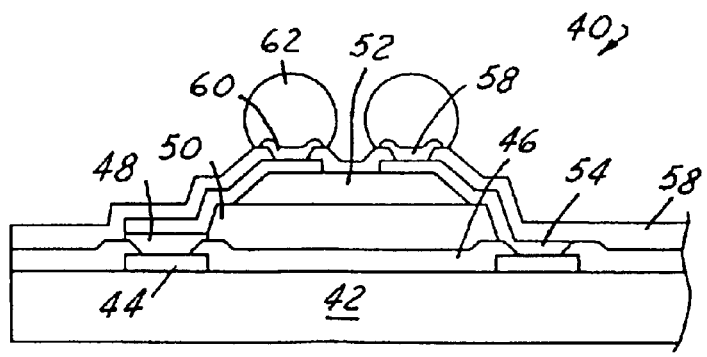

As shown in FIG. 3D, after the formation of the metal trace 54, a dielectric, insulating material layer is deposited on top of the silicon substrate 42 as a passivation layer. A suitable dielectric material for such purpose may be an elastomer, polyimide or BCB (benzo cyclo butene). The passivation layer 56 covers the entire surface of the silicon substrate 42 with the exception of the end of the metal trace 54 on top of the second compliant layer 52 such that a window opening is formed on top of the second I/O pad 58. Various techniques may be used to form the passivation layer 56, for instance, a photoresist stud may first be formed on top of the second I/O pad 58 before the passivation layer 56 is deposited. The photoresist and the passivation layer on top of the stud can then be removed to expose the window opening. The window opening may further be formed by first depositing the passivation layer 56 and then photolithographically exposing the second I/O pad 58. The window opening may further be formed by directly using laser to remove the passivation layer 56.

A UBM layer 60 may be deposited on top of the passivation layer 56 and then patterned such that the UBM layer 60 only remains on top of the second I/O pad 58. The UBM layer 60 may be deposited by a technique of electroless plating or thin film deposition. After the formation of the UBM layer 60, a solder bump (not shown) may be formed on top of the UBM layer 60 by a technique such as screen printing, stencil printing, electrodeposition, electroless deposition or pick-and-place. After a reflow process, the solder bump is formed into a solder ball 62.

In the preferred embodiment process of the present invention, shown in FIGS. 3A~3D, the metal cap layer 48 is used for electrically connecting the first I/O pad 44 and the second I/O pad 58. The first, second compliant layers 50,52 under the metal wire 54 are used for stress buffering in order to produce a wafer level package that has substantially improved reliability.

An alternate embodiment of the present invention process is shown in FIGS. 4A~4D. The alternate embodiment of the present invention process is similar to that shown in the preferred embodiment except that the second compliant layer 52 is printed into a single protruded island structure, instead of a plurality of protruded islands such as that shown in FIGS. 3A~3D.

The present invention novel wafer level package that incorporated dual compliant layers, and optionally, metal cap layers on top of the I/O pads, and a method for forming the package have therefore been amply described in the above description and in the appended drawings of FIGS. 2A~4D.

While the present invention has been described in an illustrative manner, it should be understood that the terminology used is intended to be in a nature of words of description rather than of limitation.

Furthermore, while the present invention has been described in terms of the preferred and alternate embodiments, it is to be appreciated that those skilled in the art will readily apply these teachings to other possible variations of the inventions.

The embodiment of the invention in which an exclusive property or privilege is claimed are defined as follows.

What is claimed is:

1. A wafer level package incorporating dual compliant layers comprising:
    a wafer having a multiplicity of IC dies formed on an active surface; each of said multiplicity of IC dies further comprises:
    a plurality of first I/O pads formed on a top surface insulated by a first dielectric layer deposited therein-between;
    a plurality of metal cap layers with one formed on each of said plurality of first I/O pads providing electrical communication with said pads; said plurality of metal cap layers each having a thickness sufficiently small so as to allow an adjacent tapered shoulder of a first compliant layer to be later formed;
    a first compliant layer of a first elastic material having tapered shoulder formed on top of said first dielectric layer;
    a second compliant layer of a second elastic material on top of said first compliant layer;
    a plurality of metal traces formed on top of said first and second compliant layers each in electrical communication with one of said plurality of metal cap layer at a first end and extends toward a center of said IC die at a second end;
    a second dielectric layer formed on top of said plurality of metal traces insulating the latter from each other while exposing a plurality of second I/O pads with one on each of said second end of said plurality of metal traces; and
    a plurality of solder balls formed on said plurality of second I/O pads.

2. A wafer level package incorporating dual compliant layers according to claim 1, wherein said first I/O pads are arranged in a periphery array and said second I/O pads are arranged in an area array.

3. A wafer level package incorporating dual compliant layers according to claim 1, wherein said first and second I/O pads are fabricated of a material selected from the group consisting of Cu, Al, Cu alloys and Al alloys.

4. A wafer level package incorporating dual compliant layers according to claim 1, wherein said first complaint layer being formed of an elastic material having a Young's modulus of less than 6 MPa.

5. A wafer level package incorporating dual compliant layers according to claim 1, wherein said second compliant layer being formed of an elastic material having a Young's modulus smaller than a Young's modulus of said first compliant layer.

6. A wafer level package incorporating dual compliant layers according to claim 1, wherein said first compliant layer being formed to a thickness between about 4 $\mu$m and about 20 $\mu$m.

7. A wafer level package incorporating dual compliant layers according to claim 1, wherein said second compliant layer being formed to a thickness larger than a thickness of said first compliant layer.

8. A wafer level package incorporating dual compliant layers according to claim 1 further comprising a under-bump-metallurgy layer in-between said plurality of solder balls and said plurality of second I/O pads.

9. A wafer level package incorporating dual compliant layers according to claim 1, wherein said second compliant layer being formed in a single protruded island on top of said first compliant layer.

10. A wafer level package incorporating dual compliant layers according to claim 1, wherein said second compliant layer being formed in a plurality of protruded islands on top of said first compliant layer.

11. A wafer level package incorporating dual compliant layers according to claim 1, wherein said plurality of metal cap layers each having a thickness of less than 10 $\mu$m.

12. A wafer level package incorporating dual compliant layers according to claim 1, wherein said first compliant layer formed on top of said first dielectric layer does not have angles of corners that cover edges of said first dielectric layer smaller than 105°.

13. A wafer level package incorporating dual compliant layers comprising:
    a wafer having a multiplicity of IC dies formed on an active surface; each of said multiplicity of IC dies further comprises:
    a plurality of first I/O pads formed on a top surface insulated by a first dielectric layer deposited therein-between;
    a first compliant layer of a first elastic material having tapered shoulder formed on top of said first dielectric layer;
    a second compliant layer of a second elastic material on top of said first compliant layer;
    a plurality of metal traces formed on top of said first and second compliant layers each in electrical communication with one of said plurality of first I/O pads at a first end and extends toward a center of said IC die at a second end;
    a second dielectric layer formed on top of said plurality of metal traces insulating the latter from each other while exposing a plurality of second I/O pads with one on each of said second end of said plurality of metal traces; and a plurality of solder balls formed on said plurality of second I/O pads.

14. A wafer level package incorporating dual compliant layers according to claim 13, wherein said second compliant layer being formed of an elastic material having a Young's modulus smaller than a Young's modulus of said first compliant layer.

15. A wafer level package incorporating dual compliant layers according to claim 13, wherein said second compliant layer being formed to a thickness larger than a thickness of said first compliant layer.

16. A wafer level package incorporating dual compliant layers according to claim 13, wherein said first compliant layer formed on top of said first dielectric layer does not have angles of corners that cover edges of said first dielectric layer smaller than 105°.

* * * * *